United States Patent [19]

Suzuki et al.

[11] Patent Number: 4,489,399
[45] Date of Patent: Dec. 18, 1984

[54] READ-ONLY MEMORY DEVICE

[75] Inventors: Yasuo Suzuki, Yokohama; Hiroshi Hirao, Kawasaki, both of Japan

[73] Assignee: Fujitsu Limited, Kawasaki, Japan

[21] Appl. No.: 354,500

[22] Filed: Mar. 3, 1982

[30] Foreign Application Priority Data

Mar. 6, 1981 [JP] Japan .................................. 56-32125

[51] Int. Cl.³ .............................................. G11C 7/00
[52] U.S. Cl. ..................................... 365/104; 365/230
[58] Field of Search ........................ 365/104, 189, 230

[56] References Cited

U.S. PATENT DOCUMENTS 4,263,664  4/1981  Owen et al. .......................... 365/230
4,419,747  12/1983  Jordan .................................. 365/96

Primary Examiner—James W. Moffitt
Attorney, Agent, or Firm—Staas & Halsey

[57] ABSTRACT

A read-only memory device comprises a plurality of groups of bit lines ($BL_0$, $BL_1$, ..., $BL_{63}$). One bit line within each group is selected by first column address decoders (4-1) and one group is selected by second column address decoders (8-0~8-3). One load element ($Q_{L0}$, $Q_{L1}$, $Q_{L2}$, $Q_{L3}$) is provided in each second column address decoder to pull up the potentials of the bit lines.

19 Claims, 6 Drawing Figures

READ-ONLY MEMORY DEVICE

BACKGROUND OF THE INVENTION

The present invention relates to a read-only memory (ROM) device, more particularly, to the output portion of a large capacity ROM device such as a mask ROM device or an EPROM (erasable programmable ROM) device.

In a mask ROM device, the binary data "0" or "1" of a memory cell at each intersection between word lines and bit lines corresponds to:

the presence or absence of an enhancement type transistor;

the high or low threshold voltage of a transistor;

the enhancement type or depletion type of a transistor; or the presence or absence of a contact window (throughhole) which connects one of the bit lines to a transistor.

Similarly, in an EPROM device, the binary data "0" or "1" of a memory cell corresponds to the high or low threshold voltage of a transistor, which is determined by injecting carriers into a floating-gate due to the tunnel effect or avalanche breakdown. In any ROM device, since a memory cell serves only as a switch, a memory cell has no driving power for charging a corresponding bit line during the read mode. Therefore, one or more load elements are necessary for charging the bit lines during the read mode.

According to a first conventional ROM device, a plurality of switching transistors (gates) are provided between bit lines and data bus lines which are connected to a sense amplifier. When one of the switching transistors is selected by a group of column address decoders, the selected transistor is turned on so as to connect one of the bit lines to one of the data bus lines. As a result, one bit line is connected through the selected switching transistor to the sense amplifier. In this case, a load element is provided in the sense amplifier, so as to charge the selected bit line and all the data bus lines, that is, pull up the potentials of these lines. During the read mode, for one memory cell, the potential of a word line corresponding to this cell is selected and connected to the sense amplifier. As a result, the potential of the selected bit line is decreased or retained in accordance with the on-state or off-state of the memory cell. Thus, the memory data thereof is read out at the sense amplifier.

In such a ROM device, if it is of a small capacity such as 16 kbits and 65 kbits, the load capacity of the data bus lines driven by one load element is not large enough to cause a problem.

However, in a large capacity ROM device such as a 256 kbit device, the number of bit lines, the number of switching transistors, and the number of the data bus lines is increased. As a result, to increase the pulling-up speed of the potentials of the selected bit line and the data bus lines, the driving power or conductance $g_m$ of the load element must increase. On the other hand, since the area of a memory cell becomes small, the conductance $g_m$ of an on-state memory cell also becomes small. As a result, the dimensions of the switching transistors must be large and, in addition, the conductance $g_m$ of the load element must decrease, since the ratio of the conductance $g_m$ of the on-state memory cell to that of the load element must be definite to ensure a reliable read operation. It is difficult to increase the driving power or conductance $g_m$ of the load element and, also to perform rapid pulling-up of the potentials of the bit lines and the data bus lines to perform a high speed read operation.

According to a second conventional ROM device, bit lines are divided into a plurality of groups. One bit line within each group is selected by first column address decoders and, in addition, one group is selected by second column address decoders. As a result, one selected bit line is connected to one of the data bus lines. Compared with the first conventional device, the load capacity driven by the load element becomes small, and the driving power of the load element in the sense amplifier may be small. However, even in this case, since only one load element is provided, it is difficult to perform rapid pull-up of the potential of the bit lines and the data bus lines and, accordingly, to perform a high speed read operation in a large capacity ROM device, such as a 256 kbit device.

SUMMARY OF THE INVENTION

It is, therefore, an object of the present invention to provide a ROM device with a high speed read operation even when the device has a large capacity.

It is another object of the present invention to provide a ROM device having a simple structure.

According to the present invention, there is provided a read-only memory device comprising: first and second power supplies; a plurality of word lines; a plurality of groups of bit lines; a plurality of read-only memory cells located at intersections between the word lines and the bit lines; a plurality of data bus lines, the number of which is the same as that of the groups of bit lines; a plurality of groups of switching gates, each group of switching gates being connected between one of the groups of bit lines and one of the data bus lines; a plurality of first column decoders, connected to the switching gates, for selecting one switching gate within each group of switching gates in accordance with first column address information, so as to turn on the selected switching gate; a plurality of second column decoders, each connected to the first and second power supplies and to one of the data bus lines, for selecting one of the data bus lines in accordance with a second column address information, charging the selected data bus line; a sense amplifier connected to the data bus lines; and an output buffer connected to the sense amplifier.

The present invention will be more clearly understood from the description as set forth below contrasting the present invention with the conventional devices and with reference to the accompanying drawings.

DESCRIPTION OF THE PREFERRED EMBODIMENTS

Figure 1:
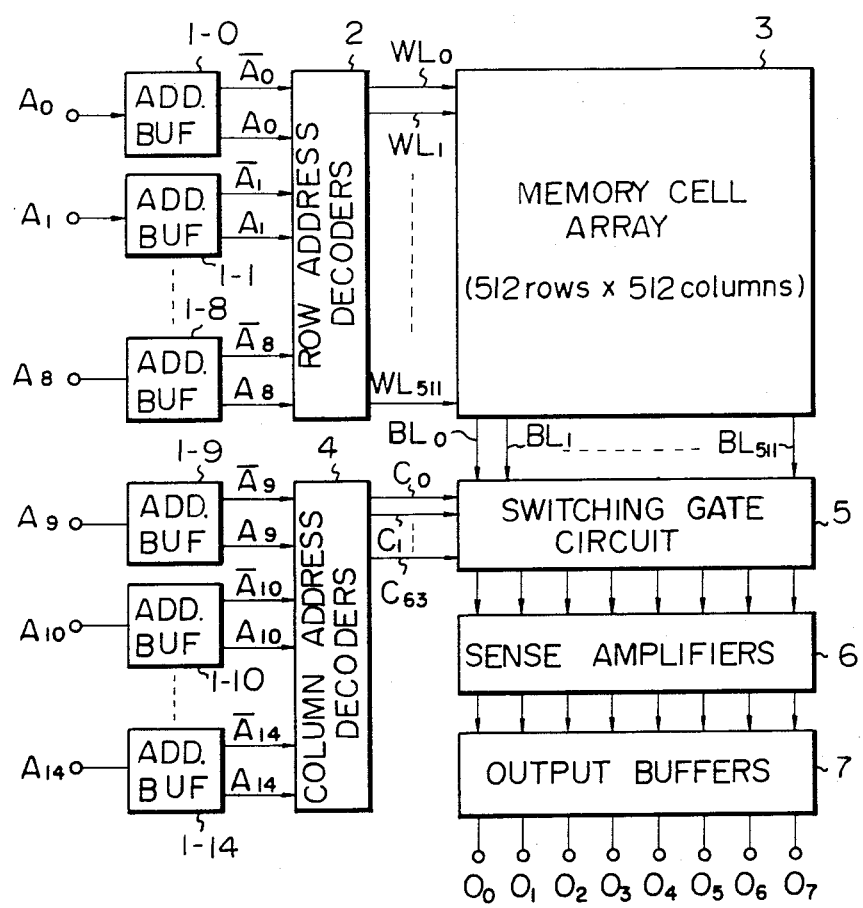
FIG. 1 is a block circuit diagram of a first conventional ROM device.

FIG. 1 is a block diagram of a conventional 256 kbit ($=2^{18}$) MOS (broadly, metal-insulated semiconductor (MIS)) ROM device. The device comprises row address buffers 1-0, 1-1, . . . , 1-8 for converting row address signals $A_0, A_1, \ldots, A_8$ of a transistor-transistor logic (TTL) level into address signals $A_0, A_1, \ldots, A_8$ of a MOS level and their inverted signals $\overline{A}_0, \overline{A}_1, \ldots, \overline{A}_8$. In addition, the device comprises column address buffers 1-9, 1-10, . . . , 1-14 for converting column address signals $A_9, A_{10}, \ldots A_{14}$ of a TTL level into address signals $A_9, A_{10}, \ldots, A_{14}$ of a MOS level and their inverted signals $\overline{A}_9, \overline{A}_{10}, \ldots, \overline{A}_{14}$. Further, the device comprises row address decoders 2 for decoding the signals $A_0, \overline{A}_0, A_1, \overline{A}_1, \ldots, A_8, \overline{A}_8$ (MOS level) to select one of word lines $WL_0, WL_1, \ldots WL_{511}$, that is, one row from a memory cell array 3. In addition, the device comprises column address decoders 4 for decoding the address signals $A_9, \overline{A}_9, \ldots, A_{14}, \overline{A}_{14}$ (MOS level) to select one of the column selection lines $C_0, C_1, \ldots, C_{63}$, that is, eight columns from the memory cell array 3. Therefore, eight of the bit lines $BL_0, BL_1, \ldots, BL_{511}$ are selected and connected through a switching gate circuit 5 to sense amplifiers 6 which are also connected to output buffers 7. Thus, eight parallel bits of data are obtained at output terminals $O_0, O_1, \ldots, O_7$.

Figure 2:
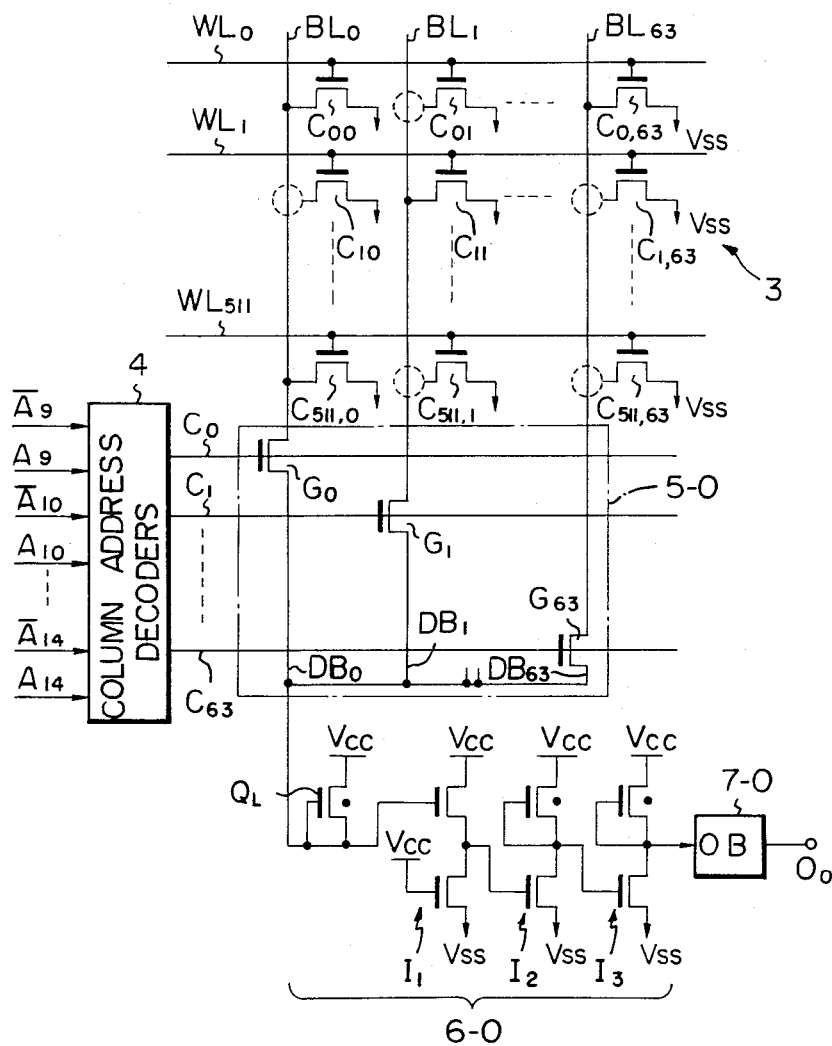
FIG. 2 is a partial circuit diagram of the device of FIG. 1.

FIG. 2 is a partial circuit diagram of the device of FIG. 1. In FIG. 2, only the circuit configuration regarding the output terminal $O_0$ is illustrated. The other circuit configurations regarding the output terminals $O_1$ through $O_7$ are omitted in order to simplify the description.

In the memory cell array 3, the binary data "0" or "1" of a memory cell $C_{00}$ ($C_{01}, \ldots, C_{511,63}$) at each intersection between the word lines $WL_0, WL_1, \ldots, WL_{511}$ and the bit lines $BL_0, BL_1, \ldots, BL_{63}$ corresponds to the presence or absence of a contact throughhole which connects one of the bit lines $BL_0, BL_1, \ldots, BL_{63}$ to a drain of a MOS transistor.

The switching gate circuit 5-0 comprises switching gates $G_0, G_1, \ldots, G_{63}$ which are selected by the column address decoders 4. When the switching gates $G_0, G_1, \ldots, G_{63}$, which are in this case MOS transistors, are turned on, the bit lines $BL_0, BL_1, \ldots, BL_{63}$ are electrically connected to data bus lines $DB_0, DB_1, \ldots, DB_{63}$, respectively.

The sense amplifier 6-0 comprises a depletion type source-gate connected MOS transistor $Q_L$ which serves as a load element, and three inverters $I_1, I_2$ and $I_3$. In this case, the load transistor $Q_L$ is used for charging all the data bus lines $DB_0, DB_1, \ldots, DB_{63}$, the switching gates $G_0, G_1, \ldots, G_{63}$ and one selected bit line, in other words, for pulling up the potentials thereof. For example, when only the switching gate $G_0$ is turned on and the potential of word line $WL_0$ is caused to be high so as to select the memory cell $C_{00}$, the potential of the bit line $BL_0$ is reduced since the conductance $g_m$ of the cell $C_{00}$ is set to be larger than that of the load transistor $Q_L$. Of course, in this case, the area of the switching gate $G_0$ is large enough. Therefore, the potential of the bit line $BL_0$ and the potentials of the data bus lines $DB_0$, $DB_1, \ldots, DB_{63}$ are pulled down. At this time, such low potential is sensed by the sense amplifer 6-0, and transmitted to an output buffer 7-0. However, when only the switching gate $G_1$ is turned on and the potential of the word line $WL_0$ is caused to be high so as to select the memory cell $C_{01}$, the high potential of the bit line $BL_1$ remains at a high level, since the memory cell $C_{01}$ has no contact throughhole. Therefore, the potential of the bit line $BL_1$ and the potentials of the data bus lines $DB_0$, $DB_1, \ldots, DB_{63}$ remain at a high level. This high potential is sensed by the sense amplifier 6-0 and transmitted to the output buffer 7-0. In order to increase the pulling-up speed of the potentials of the bit lines and the data bus lines, the driving power or conductance $g_m$ of the load transistor $Q_L$ must be large. It is difficult to increase the driving power or conductance $g_m$ of the load transistor $Q_L$, because the conductances $g_m$ of the on-state memory cells are small. Thus, in the device of FIGS. 1 and 2, it is difficult to perform rapid pulling-up of the potentials of the bit lines $BL_0, BL_1, \ldots, BL_{63}$ and the data bus lines $DB_0, DB_1, \ldots, DB_{63}$. Further, since the column address decoders 4 are complex due to the large number therein (which is, in FIG. 2, 64), the device of FIG. 2 is large in scale.

Figure 3:
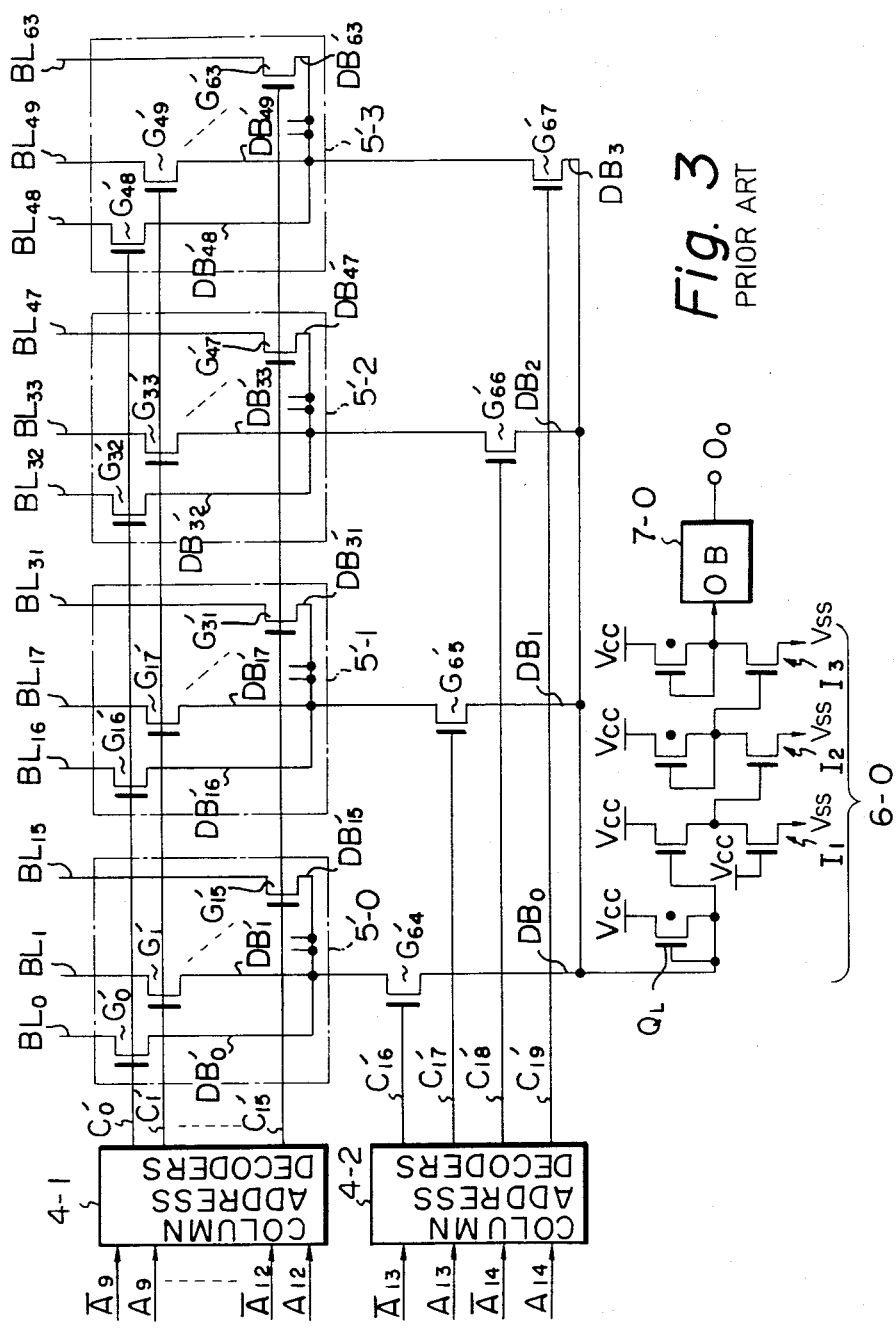
FIG. 3 is a circuit diagram of a second conventional ROM device.

FIG. 3 is a circuit diagram of a second conventional ROM device. In FIG. 3, the bit lines $BL_0, BL_1, \ldots, BL_{63}$ are divided into a plurality of groups, for example, four groups. The first group includes the bit lines $BL_0$, $BL_1, \ldots, BL_{15}$; the second group includes the bit lines $BL_{16}, BL_{17}, \ldots, BL_{31}$; the third group includes the bit lines $BL_{32}, BL_{33} \ldots, BL_{47}$; and the fourth group includes the bit lines $BL_{48}, BL_{49} \ldots, BL_{63}$. First column address decoders 4-1 decode the address signals $A_9, \overline{A}_9, \ldots, A_{12}, \overline{A}_{12}$ so as to select or turn on one switching gate at a common position of each of the switching gate circuits 5'-0, 5'-1, 5'-2, and 5'-3 through column selection lines $C_0', C_1', \ldots, C_{15}'$. For example, when the potential of the line $C_0'$ is caused to be high, the switching gates $G_0', G_{16}', G_{32}'$, and $G_{48}'$ are turned on. In addition, second column decoders 4-2 decode the address signals $A_{13}, \overline{A}_{13}, A_{14}$ and $\overline{A}_{14}$ so as to select or turn on one of switching gates $G_{64}', G_{65}', G_{66}'$, and $G_{67}'$ through column selection lines $C_{16}', C_{17}', C_{18}'$, and $C_{19}'$. Since the number of the column address decoders 4-1 and 4-2 (which is, in FIG. 3, 20) is less than in the device of FIGS. 1 and 2, the device of FIG. 3 is relatively small.

The load transistor $Q_L$ of the sense amplifier 6-0 is used for charging the data bus lines $DB_0, DB_1, DB_2$ and $DB_3$ and the switching gates $G_{64}', G_{65}', G_{66}'$ and $G_{67}'$. In addition, if the switching gate $G_{64}'$ is turned on, the load transistor $Q_L$ charges the data bus lines $DB_0'$ through $DB_{15}'$ and the switching gates $G_0'$ through $G_{15}'$, and one of the bit lines $BL_0$ through $BL_{15}$. Therefore, the load capacity driven by the load transistor $Q_L$ is reduced as compared with the device of FIG. 2, and the pulling-up operation, that is, the read operation speed is improved.

Figure 4:
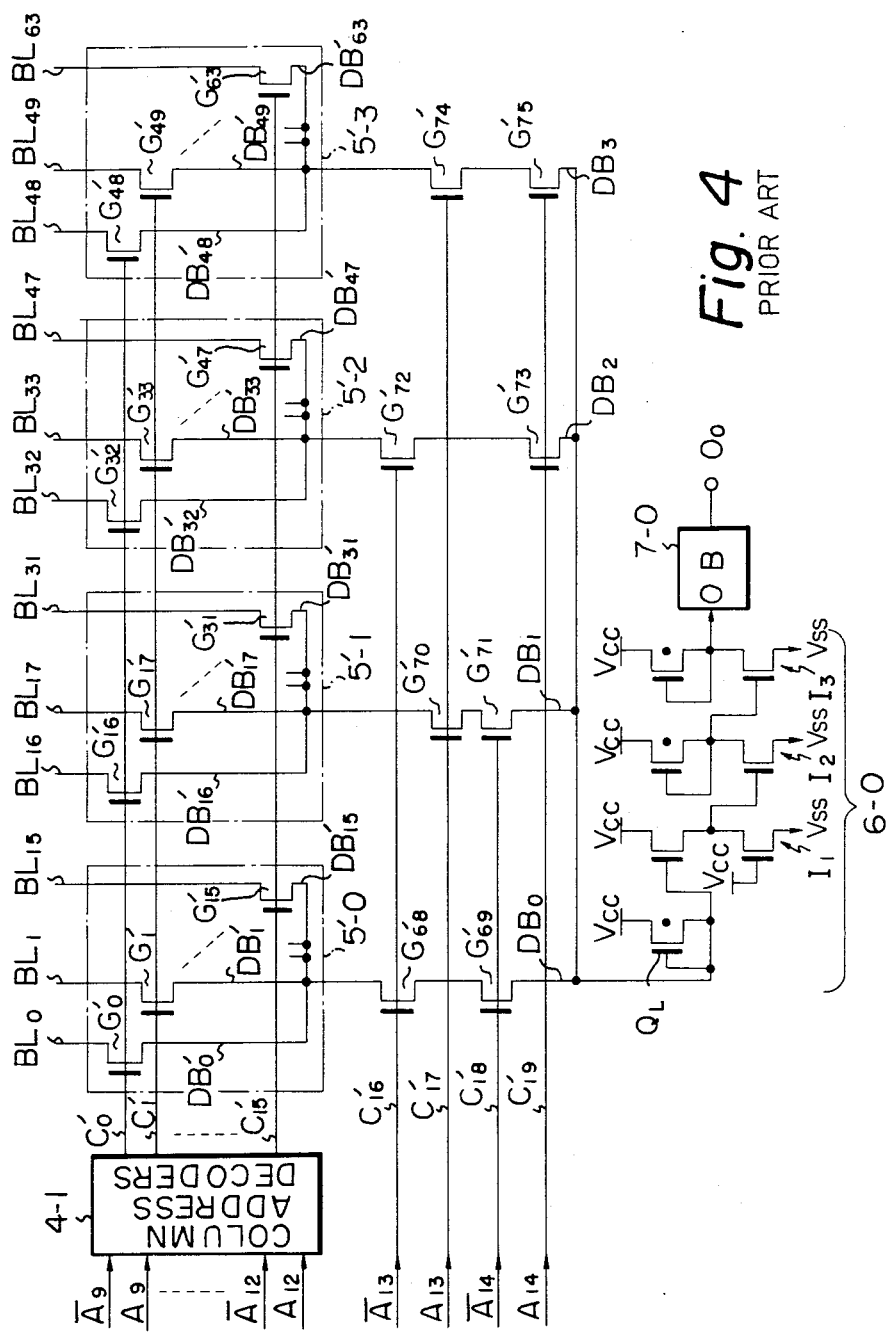
FIG. 4 is a circuit diagram of a third conventional ROM device similar to the second conventional device of FIG. 3.

FIG. 4 is a circuit diagram of a third conventional ROM device similar to the second conventional device of FIG. 3. In FIG. 4, switching gates $G_{68}'$ through $G_{75}'$ which directly receive the address signals $A_{13}, \overline{A}_{13}, A_{14}$ and $\overline{A}_{14}$, are provided instead of the switching gates $G_{64}'$ through $G_{67}'$ of FIG. 3. Therefore, the switching gates $G_{68}'$ through $G_{75}'$ serve also as the decoders 4-2 of FIG. 3.

However, in any of the devices of FIGS. 3 and 4, since the pulling-up operation is performed by one load transistor $Q_L$ provided in the sense amplifier 6-0, it is difficult to perform a rapid pulling-up operation in a large capacity device such as a 256 kbit device. In addition, since switching gates are provided between the switching gate circuits 5'-0 through 5'-3 and the sense amplifier 6-0, the device has a relatively complex structure.

Figure 5:
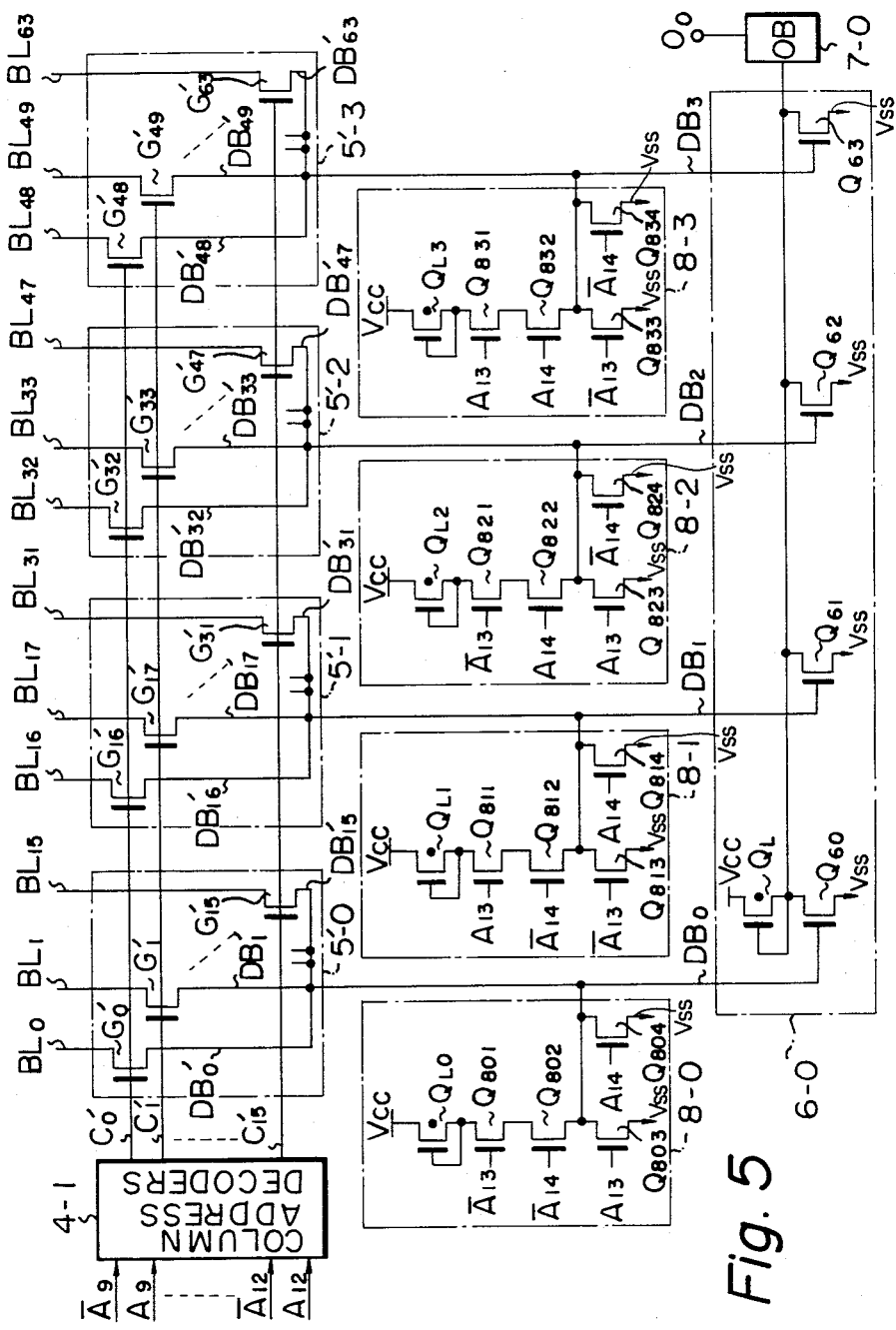
FIG. 5 is a circuit diagram of one embodiment of the ROM device according to the present invention.

FIG. 5 is a circuit diagram of one embodiment of the ROM device according to the present invention. In FIG. 5, the switching gate circuits 5'-0, 5'-1, 5'-2, and 5'-3 are connected directly to the sense amplifier 6-0 by the data bus lines $DB_0$, $DB_1$, $DB_2$ and $DB_3$, respectively. The switching gates $G_{64}'$ through $G_{75}'$ of FIGS. 3 and 4 are not provided, thereby simplifying the device.

According to the present invention, second column decoders 8-0, 8-1, 8-2, and 8-3 each having load functions are provided. The decoder 8-0 comprises: a depletion type source-gate connected transistor $Q_{L0}$ which serves as a load element operatively connectable to a first power supply $V_{cc}$, having a voltage, for example, of 5 V; an AND circuit formed by two transistors $Q_{801}$ and $Q_{802}$ connected in series; and a NOR circuit formed by two transistors $Q_{803}$ and $Q_{804}$ connected in parallel and operatively connectable to a second power supply $V_{SS}$, having a voltage, for example, of 0 V. The transistors $Q_{801}$ and $Q_{802}$ have gates for receiving the address signals $\overline{A}_{13}$ and $\overline{A}_{14}$, respectively, while the transistors $Q_{803}$ and $Q_{804}$ have gates for receiving the address signal $A_{13}$ and $A_{14}$, respectively. The other decoders 8-1, 8-2, and 8-3 are the same structure as the decoder 8-0.

When the potentials of the address signals $A_{13}$ and $A_{14}$ are both low and, the potentials of the address signals $\overline{A}_{13}$ and $\overline{A}_{14}$ are both high, the transistors $Q_{801}$ and $Q_{802}$ are turned on and the transistors $Q_{803}$ and $Q_{804}$ are turned off. As a result, the load transistor $Q_{L0}$ charges the data bus line $DB_0$ and the switching gates $G_0'$ through $G_{15}'$ of the switching gates circuit 5'-0. As a result, the potential of one of the bit lines $BL_0$ through $BL_{15}$ which is selected by the decoders 4-1 is pulled up to a high level. Thus, the decoder 8-0 is in the charging (pulling-up) mode. Note that, in this case, the other decoders 8-1, 8-2, and 8-3 are not in the charging mode, since, in these decoders, one or two of the transistors of the AND circuit are turned off and one or two of the transistors of the NOR circuit are turned on. In addition, when a selected cell (not shown) is conductive, the high potential of the selected bit line is decreased and, accordingly, the potential of the data bus line $DB_0$ is decreased. However, when the selected cell is nonconductive, the high potential of the selected bit line remains high and, the potential of the data bus line $DB_0$ remains high.

The sense amplifier 6-0 comprises a depletion type source-gate connected transistor $Q_L$, operatively connectable to the first power supply $V_{cc}$, which serves as a load element, and a NOR circuit formed by transistors $Q_{60}$, $Q_{61}$, $Q_{62}$, and $Q_{63}$, operatively connectable to the second power supply $V_{SS}$. When the potential of the data bus line $DB_0$ is high and the potentials of the others are low, the output potential of the sense amplifier 6-0 is low. However, when the potentials of all the data bus lines $DB_0$, $DB_1$, $DB_2$, and $DB_3$ are low, the output potential of the sense amplifier 6-0 is high.

In this embodiment of the present invention, one load transistor $Q_{L0}$ ($Q_{L1}$, $Q_{L2}$, $Q_{L3}$) is provided in each of the decoders 8-0 (8-1, 8-2, and 8-3) and is operatively connectable to the first power supply $V_{cc}$ for driving a small number of data bus lines and bit lines. This is, since the load capacity driven by each load transistor $Q_{L0}$, $Q_{L1}$, $Q_{L2}$, or $Q_{L3}$ is small, it is possible to perform a rapid pulling-up operation and, accordingly, perform a rapid read operation.

It should be noted that, since the sense amplifier 6-0 uses a NOR circuit, the load capacity driven by the load transistor $Q_L$ is small, which is also advantageous in high speed read operations.

The circuits of FIG. 5 is based on n-channel transistor circuits, however, p-channel transistor circuits can also be applied.

Figure 6:
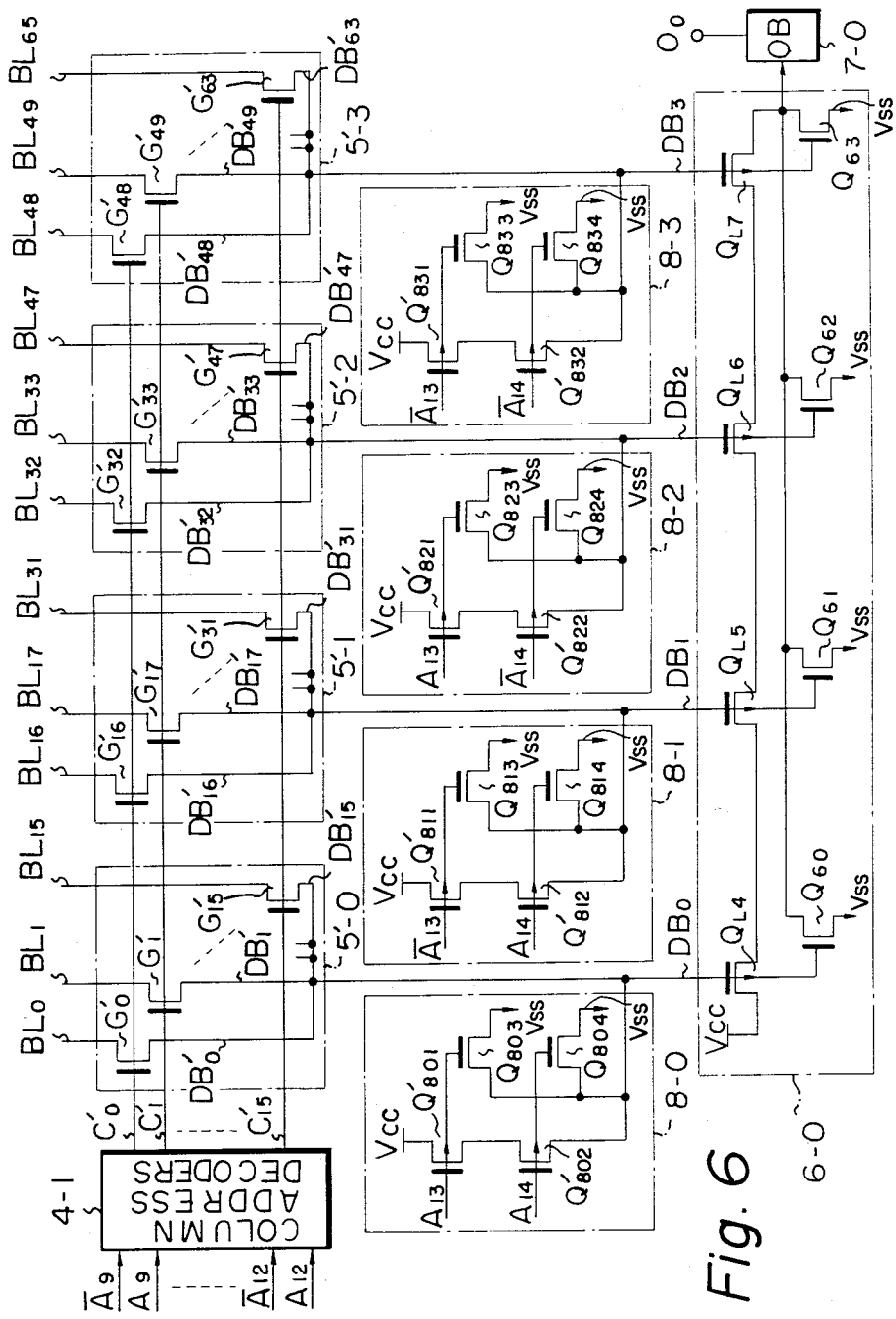
FIG. 6 is a circuit diagram of another embodiment of the ROM device according to the present invention.

FIG. 6 is a circuit diagram of another embodiment of the ROM device according to the present invention. The device of FIG. 6 is manufactured by using Complementary MOS (CMOS) technology. That is, in the decoders 8-0, 8-1, 8-2, and 8-3, the transistors $Q_{801}'$, $Q_{802}'$, $Q_{811}'$, $Q_{812}'$, $Q_{821}'$, $Q_{822}'$, $Q_{831}'$, and $Q_{832}'$ are of a p-channel type and are connected to the first power supply $V_{cc}$, while the transistors $Q_{803}$, $Q_{804}$, $Q_{813}$, $Q_{814}$, $Q_{823}$, $Q_{824}$, $Q_{833}$, and $Q_{834}$ are of an n-channel type and are connected to the second power supply $V_{SS}$. In this case, the p-channel transistors are connected in series to each other to form AND circuits, while the n-channel transistors are connected in parallel to each other to form NOR circuits.

For example, when the potentials of the address signals $A_{13}$ and $A_{14}$ are both low, the p-channel type transistors $Q_{801}'$ and $Q_{802}'$ are turned on and the n-channel type transistors $Q_{803}$ and $Q_{804}$ are turned off. In this case, the on-state p-channel type transistors $Q_{801}'$ and $Q_{802}'$ act as a load element. Therefore, the pulling-up (charging) operation is performed by such a load element. In this case, the other decoders 8-1, 8-2 and 8-3 are not in the pulling-up mode. As a result, the potential of a selected bit line is pulled up and this potential becomes low or high in accordance with the on-state or off-state of a selected cell. Note that, if at least one of the potentials of the address signals $A_{13}$ and $A_{14}$ is high, the p-channel type transistors $Q_{801}'$ and $Q_{802}'$ do not as a whole serve as a load element, which is advantageous in power dissipation.

In the sense amplifier 6-0, p-channel type transistors $Q_{L4}$, $Q_{L5}$, $Q_{L6}$, and $Q_{L7}$ are connected in series to each other. When the potentials of the data bus lines $DB_0$, $DB_1$, $DB_2$, and $DB_3$ are all low, the p-channel type transistors $Q_{L4}$, $Q_{L5}$, $Q_{L6}$, and $Q_{L7}$ are all turned on. In this case, these transistors as a whole serve as a load element in the same way as the load transistor $Q_L$ of FIG. 5. However, if at least one of the data bus lines $DB_0$, $DB_1$, $DB_2$, and $DB_3$ is high, these transistors do not, as a whole, serve as a load element, which is advantageous in power dissipation.

In the above-mentioned embodiments of the present invention, bit lines are divided into four groups. However, the bit lines can be divided into any number of groups.

As explained hereinbefore, the ROM device according to the present invention has an advantage, as compared with the conventional device of FIG. 3 or 4, in that a rapid pulling-up operation, that is, a high speed read operation, can be performed since the load capacity driven by one load element is small. In addition, the device according to the present invention has a simple structure since the switching gate circuits 5'-0, 5'-1, 5'-2, and 5'-3 are connected directly to the sense amplifier 6-0.

We claim:

1. A read-only memory device, operatively connected to receive first and second column address signals, comprising:
   first and second power supplies;
   a plurality of word lines;

a plurality of groups of bit lines intersecting said plurality of word lines;

a plurality of read-only memory cells operatively connected at the intersections of said plurality of word lines and said bit lines;

a plurality of data bus lines, respectively, operatively connected to said plurality of groups of bit lines and each having a potential, the number of said data bus lines being the same as that of said groups of bit lines;

a plurality of groups of switching gates, each group of said switching gates operatively connected between a respective one of said groups of bit lines and a respective one of said data bus lines;

a plurality of first column decoders, operatively connected to said switching gates and operatively connected to receive the first column address signal, for selecting one switching gate within each said group of switching gates in accordance with the first column address signal, so as to turn on said selected switching gate;

a plurality of second column decoders, each operatively connected to said first and second power supplies and to a respective one of said data bus lines and operatively connected to receive the second column address signal, for selecting a respective one of said data bus lines in accordance with the second column address signal, so as to charge said selected data bus line by connecting said selected one of said data bus lines to said first power supply;

a sense amplifier operatively connected to said plurality of data bus lines; and an output buffer operatively connected to said sense amplifier.

2. A device as set forth in claim 1, wherein each of said plurality of second column decoders comprises:

an AND circuit, operatively connected to said first power supply and to the respective one of said data bus lines, for receiving the second column address signal; and a first NOR circuit, operatively connected to said AND circuit and to said second power supply, for receiving an inverted second column address signal.

3. A device as set forth in claim 2, wherein each of said second column decoders further comprises a first load element connected between the first power supply and said AND circuit, said first load element comprising a depletion type source-gate connected metal-insulated semiconductor (MIS) transistor.

4. A device as set forth in claim 3, wherein said AND circuit comprises a plurality of MIS transistors operatively connected in series, each said MIS transistor having a gate for receiving the second column address signal.

5. A device as set forth in claim 3, wherein said first NOR circuit comprises a plurality of MIS transistors operatively connected in parallel, each MIS transistor having a gate for receiving a portion of the inverted second column address signal.

6. A device as set forth in claim 2, wherein said sense amplifier comprises:

a second load element operatively connected to said first power supply; and a second NOR circuit operatively connected to said second load element and to said second power supply, having gates for receiving said potentials of said data bus lines.

7. A device as set forth in claim 6, wherein said second NOR circuit comprises a plurality of MIS transistors connected in parallel.

8. A device as set forth in claim 1, wherein each of said second column decoders comprises:

a plurality of MIS transistors of a first conductivity type operatively connected in series between said first power supply and a respective one of said data bus lines, having gates for receiving the second column address signal; and a plurality of MIS transistors of a second conductivity type, operatively connected in parallel between said second power supply and a respective one of said data bus lines, having gates for receiving the second column address signal.

9. A device as set forth in claim 8, wherein said sense amplifier comprises:

a plurality of MIS transistors of said first conductivity type, operatively connected in series between said first power supply and said output buffer, having gates for receiving said potentials of said data bus lines; and a plurality of MIS transistors of said second conductivity type, operatively connected in parallel between said second power supply and said output buffer, having gates for receiving said potentials of said data bus lines.

10. A read-only memory device, operatively connectable to receive first and second power supply voltages and first and second column address signals, comprising:

N word lines, where N is an integer greater than one;

K groups of bit lines, each of said K groups of bit lines comprising M bit lines, where M and K are integers greater than one, each of said M × K bit lines intersecting said N word lines;

K × M × N read-only memory cells operatively connected at said intersections of said N word lines and said M × K bit lines;

K data bus lines, respectively, operatively connected to said K groups of M bit lines;

a switching gate circuit, operatively connected between said K groups of bit lines and said K data bus lines, comprising K groups of switching gates respectively operatively connected between a respective one of said K groups of bit lines and a respective one of said K data bus lines, each group of switching gates comprising M switching gates;

a plurality of first column address decoders operatively connected to receive the first column address signal, one of said plurality of first column address decoders being selected in dependence upon receipt of the first column address signal, thereby turning on a selected one of said M switching gates within one of said K groups of switching gates;

K second column address decoders, operatively connected to receive the first and second power supply voltages and the second column address signal, one of said K second column address decoders being selected in dependence upon the second column address signal, thereby charging a selected one of said K data bus lines by connecting the selected one of said K data bus lines to receive the first power supply voltage;

a sense amplifier operatively connected to said K data bus lines; and an output buffer operatively connected to said sense amplifier.

11. A read-only memory device as set forth in claim 10, wherein each said K second column address decoders comprise:

an AND circuit operatively connected to receive the first power supply voltage and operatively connected to a respective one of said K data bus lines, for receiving the second column address signal; and a first NOR circuit, operatively connected to said AND circuit and operatively connected to receive the second power supply voltage, for receiving an inverted second column address signal.

12. A read-only memory device as set forth in claim 11, wherein of each said K column address decoders further comprises a first load element operatively connected between the first power supply and said AND circuit.

13. A read-only memory device as set forth in claim 12, wherein said first load element comprises a depletion type transistor.

14. A read-only memory device as set forth in claim 12, wherein said AND circuit comprises a plurality of transistors operatively connected in series, each of said transistors having a gate for receiving the second column address signal.

15. A read-only memory device as set forth in claim 11, wherein said first NOR circuit comprises a plurality of transistors operatively connected in parallel, each transistor having a gate for receiving a portion of the inverted second column address signal.

16. A read-only memory device as set forth in claim 11, wherein said sense amplifier comprises:

a second load element operatively connected to receive the first power supply voltage; and a second NOR circuit operatively connected to said second load element and operatively connected to receive the second power supply voltage.

17. A read-only memory device as set forth in claim 16, wherein said second NOR circuit comprises a plurality of transistors connected in parallel.

18. A read-only memory device as set forth in claim 10, wherein each of said K second column decoders comprises:

a plurality of transistors of a first conductivity type, operatively connected in series to said K data bus lines and operatively connected to receive the first power supply voltage, having gates for receiving the second column address signal; and a plurality of transistors of a second conductivity type, operatively connected in parallel with one of said K data bus lines and operatively connected to receive the second power supply voltage, having gates for receiving the second column address signal.

19. A read-only memory device as set forth in claim 18, wherein said sense amplifier comprises:

K transistors of said first conductivity type respectively operatively connected to said K data bus lines and in series with said output buffer and operatively connected to receive the first power supply voltage; and K transistors of said second conductivity type respectively operatively connected to said K data bus lines and in parallel with said output buffer and operatively connected to receive the first power supply voltage.

* * * * *